United States Patent
Huang et al.

(10) Patent No.: US 8,314,666 B2
(45) Date of Patent: Nov. 20, 2012

(54) RESONATOR, ELASTIC WAVE TRANSMISSION ELEMENT AND FABRICATION METHOD THEREOF

(75) Inventors: Tsun-Che Huang, Tainan (TW); Pin Chang, Hsinchu (TW); Chin-Hung Wang, Hsinchu (TW); Wei-Jr Lin, Tainan (TW); Li-Chi Pan, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 310 days.

(21) Appl. No.: 12/723,687

(22) Filed: Mar. 15, 2010

(65) Prior Publication Data

US 2011/0133855 A1    Jun. 9, 2011

(30) Foreign Application Priority Data

Dec. 7, 2009  (TW) .............................. 98141772 A (51) Int. Cl.
*H03H 9/00* (2006.01)
*H03H 9/205* (2006.01)
(52) U.S. Cl. ...................... 333/186; 333/197
(58) Field of Classification Search .............. 333/186, 333/197; 310/312, 320, 324
See application file for complete search history.

(56) References Cited

U.S. PATENT DOCUMENTS

| | | | |
|---|---|---|---|
| 6,600,389 B2 * | 7/2003 | Ma et al. | 333/186 |
| 7,119,636 B2 | 10/2006 | Nguyen et al. | |
| 7,176,770 B2 | 2/2007 | Ayazi et al. | |
| 7,492,241 B2 | 2/2009 | Piazza et al. | |
| 7,764,145 B2 * | 7/2010 | Iwai | 333/200 |
| 7,888,843 B2 * | 2/2011 | Ayazi et al. | 310/324 |

OTHER PUBLICATIONS

Xie et al., "1.52-GHz Micromechanical Extensional Wine-Glass Mode Ring Resonators," IEEE Transactions on Ultrasonics, Ferroelectrics, and Frequency Control, vol. 55, No. 4, Apr. 2008, pp. 890-907.
Pourkamali er al., "Low-Impedance VHF and UHF Capacitive Silicon Bulk Acoustic Wave Resonators—Part I: Concept and Fabrication," IEEE Transactions on Electron Devices, vol. 54, No. 8, Aug. 2007, pp. 2017-2023.
Piazza et al., "Piezoelectric Aluminum Nitride Vibrating Contour-Mode MEMS Resonators," Journal of Microelectromechanical Systems, vol. 15, No. 6, Dec. 2006, pp. 1406-1418.

* cited by examiner

*Primary Examiner* — Dean O Takaoka
(74) *Attorney, Agent, or Firm* — Jianq Chyun IP Office (57) ABSTRACT

A resonator, an elastic wave transmission element and a method for fabricating the transmission element are provided. The elastic wave transmission element has a first side and a second side. The elastic wave transmission element includes a plurality of structures sequentially arranged along a direction from the first side toward the second side. Each of the structures has a different defect which is different to each other. The impedance of the structures decreases gradually along the direction. As such, the elastic wave transmission element has an impedance match function.

5 Claims, 10 Drawing Sheets

RESONATOR, ELASTIC WAVE TRANSMISSION ELEMENT AND FABRICATION METHOD THEREOF

CROSS-REFERENCE TO RELATED APPLICATION

This application claims the priority benefit of Taiwan application serial no. 98141772, filed on Dec. 7, 2009. The entirety of the above-mentioned patent application is hereby incorporated by reference herein and made a part of specification.

BACKGROUND

1. Technical Field

The present disclosure relates to an elastic wave transmission element, and more particularly, to an elastic wave transmission element with impedance match function.

2. Description of Related Art

As a concept of microwave electronics, the impedance match is mainly used in a transmission line to ensure that all high frequency microwave signals are transmitted to the load and almost no signal is reflected back to the source thus improving the energy efficiency.

It is noted that transmission of elastic wave can often have the signal reflection issue. The elastic wave can also be referred to as mechanical wave. In the case of severely unmatched acoustic impedance, a large part of energy in the elastic wave can be reflected which would not meet system requirements.

SUMMARY

Accordingly, the present invention is directed to an elastic wave transmission element that uses structure defects to achieve acoustic impedance match. The elastic wave transmission element includes multiple structures which have different defects. And the multiple structures are successively arranged such that the acoustic impedance of the structures decreases gradually.

In one aspect, the present disclosure provides a resonator including a resonator base body, a first structure and a second structure. The first structure has a first end connected with a first end of the resonator base body and has a first defect. The second structure is connected to a second end of the first structure and has a second defect. The acoustic impedance of the resonator base body is greater than the acoustic impedance of the first structure, and the acoustic impedance of the first structure is greater than the acoustic impedance of the second structure.

In another aspect, the present disclosure provides a method for fabricating an elastic wave transmission element. Initially, a base body is provided, then a first defect and a second defect are successively formed in a first structure and a second structure of the base body, respectively. The acoustic impedance of the first structure is less than the acoustic impedance of the second structure.

In order to make the aforementioned and other features of the present disclosure more comprehensible, embodiments accompanied with figures are described in detail below.

DETAILED DESCRIPTION

When an elastic wave is transmitted through a transmission element, acoustic impedance unmatch can often occur which would result in the energy being unable to penetrate the transmission element. Accordingly, embodiments of the present disclosure employ gradually variant structure defects such that the elastic wave transmission element has gradual acoustic impedance to thereby achieve acoustic impedance match. The energy reflection can thus be effectively reduced. Reference will now be made in detail to the exemplary embodiments of the present disclosure, examples of which are illustrated with the accompanying drawings, wherein like reference numerals refer to like elements/steps throughout.

Figure 1:
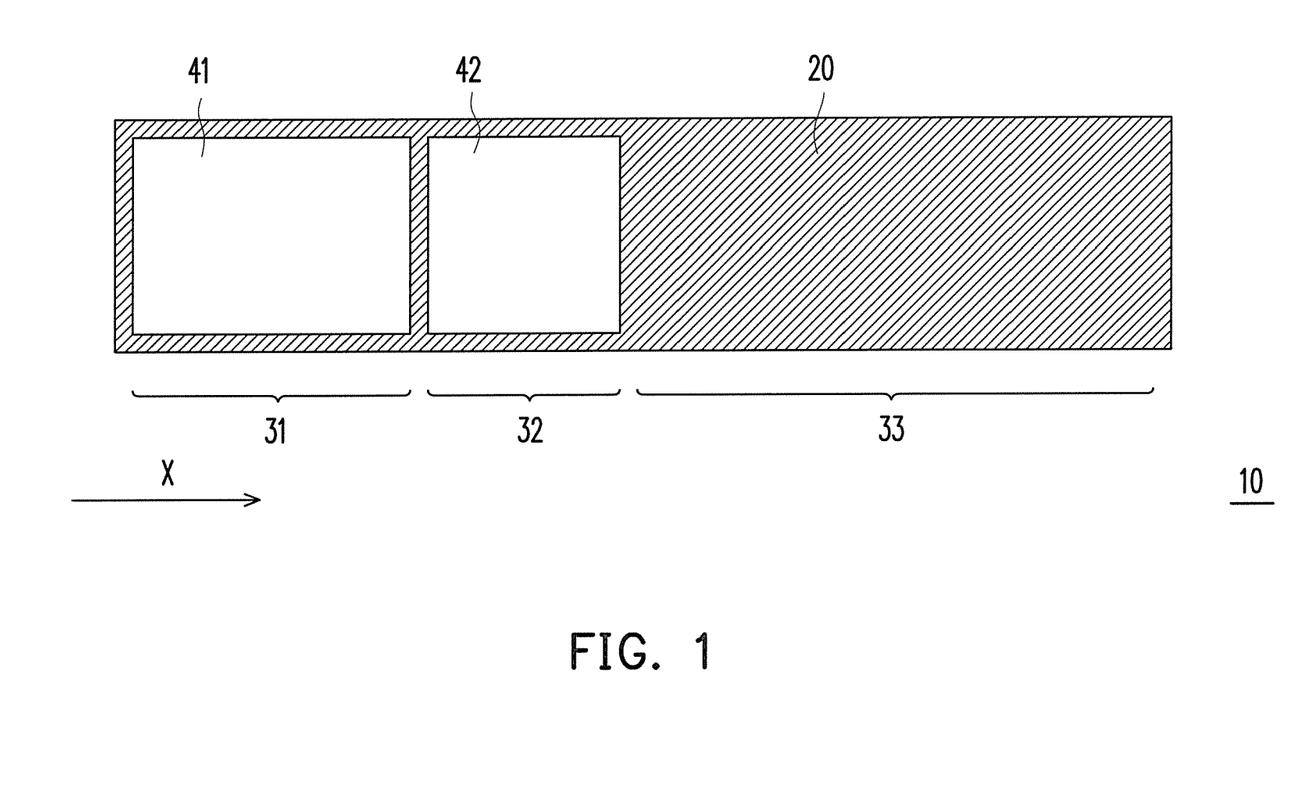
FIG. 1 illustrates an elastic wave transmission element according to one exemplary embodiment of the present disclosure.

FIG. 1 illustrates an elastic wave transmission element according to one embodiment of the present disclosure. The elastic wave transmission element 10 includes a base body 20, where the base body 20 has structures 31-33. The structure 31 has a defect 41. The structure 32 has a defect 42. In the present embodiment, the elastic wave transmission element 10 may be, for example, an acoustic transmission line, an elastic body, or another medium that can transmit elastic waves. The defects 41, 42 may be, for example, one or more slots or holes. While the defects 41 and 42 are illustrated as being rectangular in FIG. 1, this should not be regarded as limiting. Rather, in alternative embodiments of the present disclosure, the defects 41 and 42 can be modified to be of another shape, such as, circular, square, hexagonal, or another geometrical shape.

Figure 2:
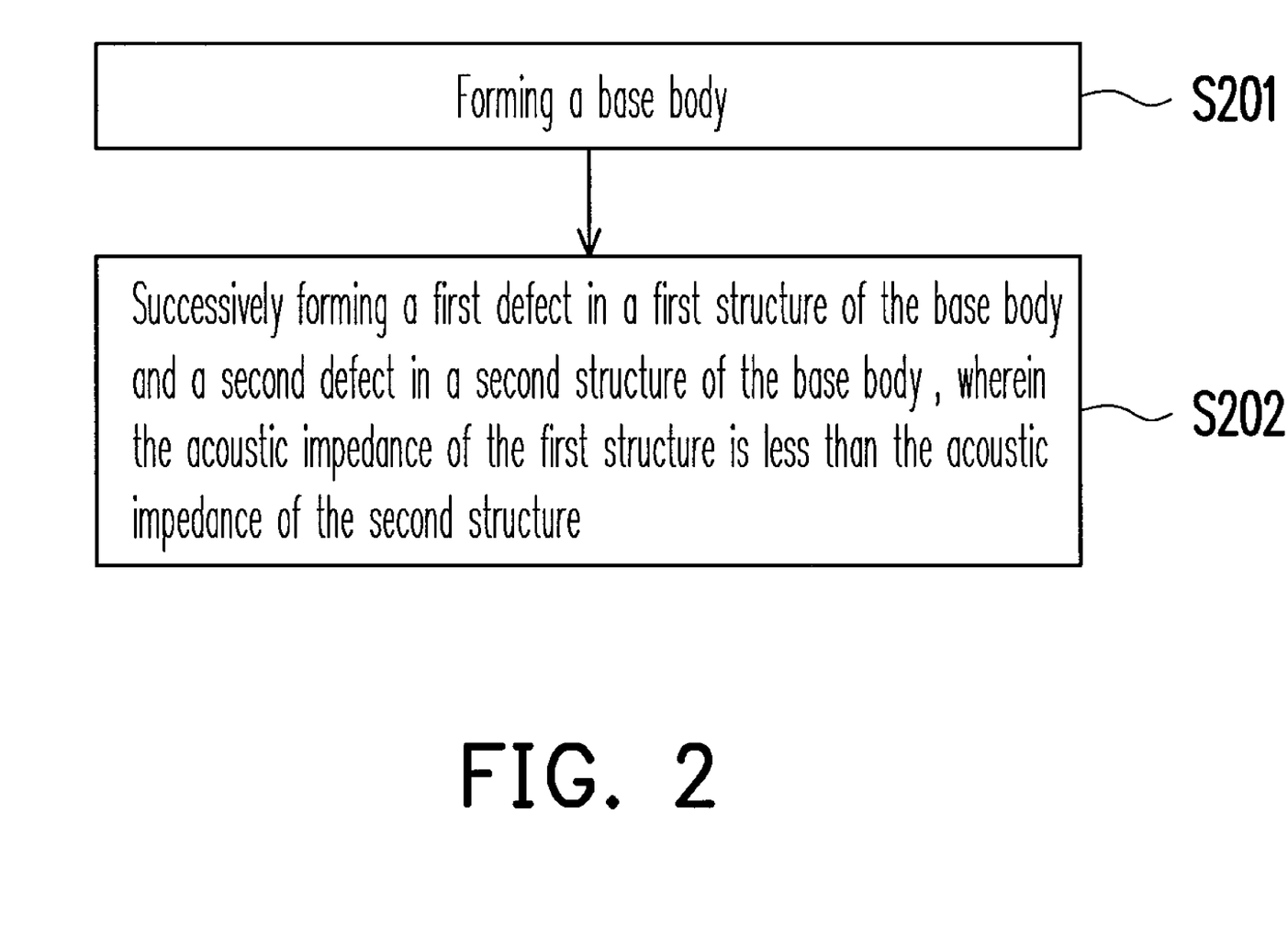
FIG. 2 is a flow chart of a method for fabricating an elastic wave transmission element according to one embodiment of the present disclosure.

FIG. 2 is a flow chart of a method for fabricating an elastic wave transmission element according to one embodiment of the present disclosure. Referring to FIG. 1 and FIG. 2, the base body 20 is first formed at step S201. The base body 20 may be made of, for example, a material with higher acoustic impedance compared with an object to be connected with.

Next, at step S202, the defect 41 in the structure 31 of the base body 20 and the defect 42 in the structure 42 of the base body 20 are successively formed along a direction which may be, for example, the elastic wave transmission direction X. In the present embodiment, forming the defect 41 in the structure 31 reduces the average acoustic impedance of the structure 31. Similarly, forming the defect 42 in the structure 32 also reduces the average acoustic impedance of the structure 32. It is noted that the defects 41 and 42 of the present embodiment are different defects, such that the acoustic impedance of the structure 31 can be configured to be less than the acoustic impedance of the structure 32 and the acoustic impedance of the structure 32 can be configured to be less than the acoustic impedance of the structure 33. In other words, the elastic wave transmission element 10 has gradually variant structures 31, 32, 33 and their defects 41, 42. Therefore, the elastic wave transmission element 10 may be capable of acoustic impedance matching.

More specifically, the structures 31 and 33 of the elastic wave transmission element 10 may be connected to a first element and a second element, respectively. The acoustic impedance of the first element may approximate to the acoustic impedance of the structure 31, and the acoustic impedance of the second element may approximate to the acoustic impedance of the structure 33. As such, when an elastic wave is transmitted from the first element through the elastic wave transmission element 10 to the second element, the energy reflection can be reduced. Likewise, when an elastic wave is transmitted from the second element through the elastic wave transmission element 10 to the first element, the energy reflection can also be reduced.

Figure 3:
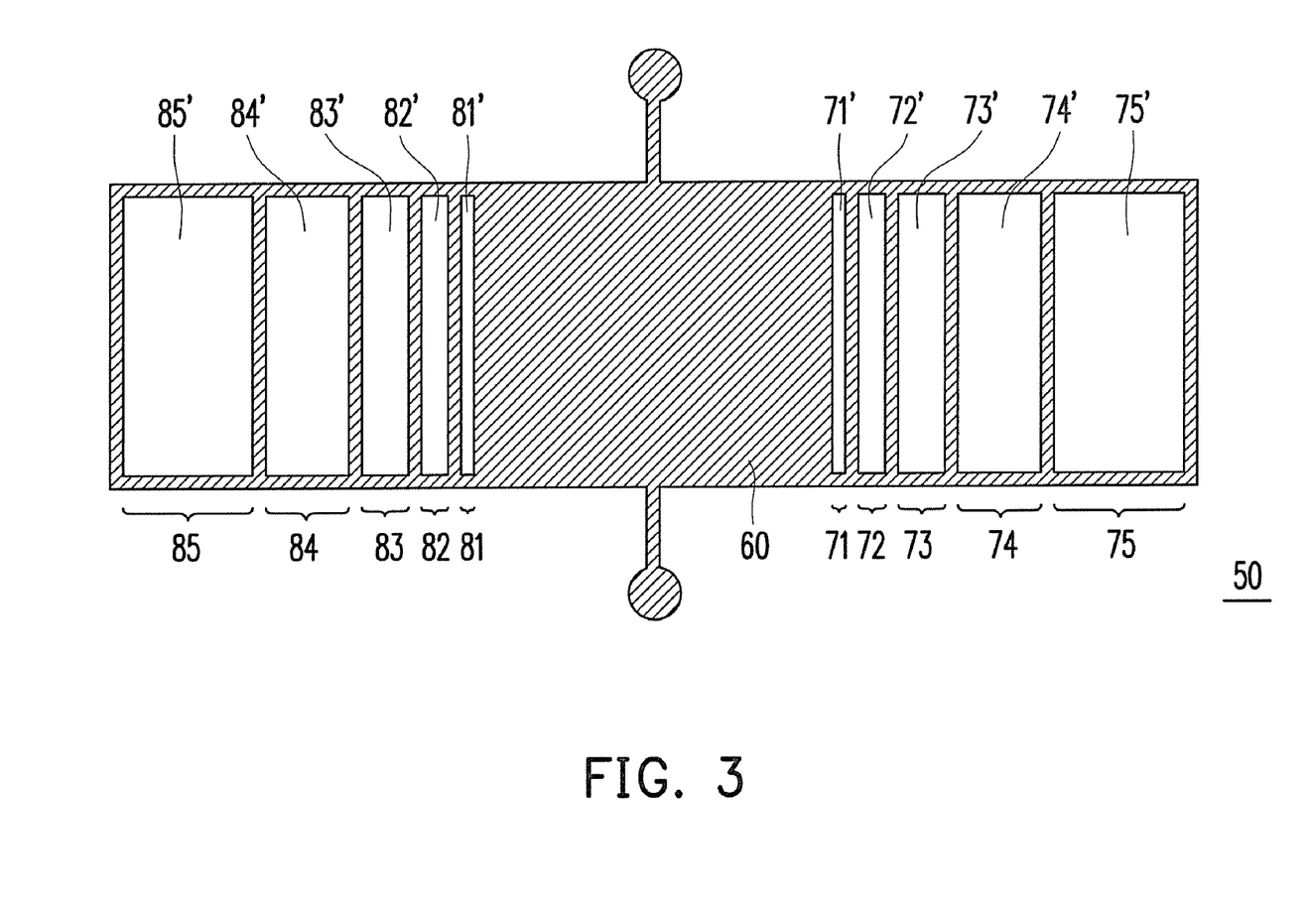
FIG. 3 illustrates a resonator according to one exemplary embodiment of the present disclosure.

It is noted that it is not intended to limit the application of the disclosed technique to the elastic wave transmission element. Rather, those skilled in the art would appreciate that the disclosed technique can be equally applicable to elements that generate or receive an elastic wave. For example, FIG. 3 illustrates a resonator according to one embodiment of the present disclosure. The resonator 50 includes a region 60 with acoustic impedance higher than other portions of the resonator 50, structures 71-75 with gradually variant acoustic impedance, and structures 81-85 with gradually variant acoustic impedance. The structures 71-75 are successively connected at a first end of the region 60 and have defects 71'-75'. The structures 81-85 are successively connected at a second end of the region 60 and have defects 81'-85', respectively. The resonator may be, for example, a low frequency or high frequency micromechanical resonator.

In general, traditional micromechanical resonators pursue an extremely low spring constant by forming slots therein to increase the magnitude of deformation thereof to thereby increase the output current and then reduce the electric impedance. However, when material of different acoustic impedance join together, the acoustic wave reflection occurs. This fact results in the energy penetration rate decreases with increasing of the reflection coefficient, which makes elastic wave energy unable to penetrate to the output end of a resonator without acoustic impedance matching. It is noted that, in the resonator 50 of the present embodiment, the structures 71-75 and 81-85 are formed with the defects 71'-75' and 81'-85'. Therefore, the acoustic impedance gradually decreases from the region 60 to the structures 71-75, and the acoustic impedance gradually decreases from the region 60 to the structures 81-85, also. As such, the resonator 50 is provided with acoustic impedance match function and therefore energy reflection can be suppressed during elastic wave transmission.

While an exemplary configuration has been given in the above embodiment with respect to the resonator, elastic wave transmission element and fabrication method thereof, it is to be understood that each company has a particular design for the resonator, elastic wave transmission element and fabrication thereof and therefore it is not intended to limit the present disclosure to this particular embodiment. In other words, any modifications are within the spirit and scope of the present disclosure as long as the element is formed with gradually variant structure defects to result in gradually varying of acoustic impedance along the transmission direction of the elastic wave. More embodiments will be described below in order to make the present disclosure more comprehensible.

Figure 4:
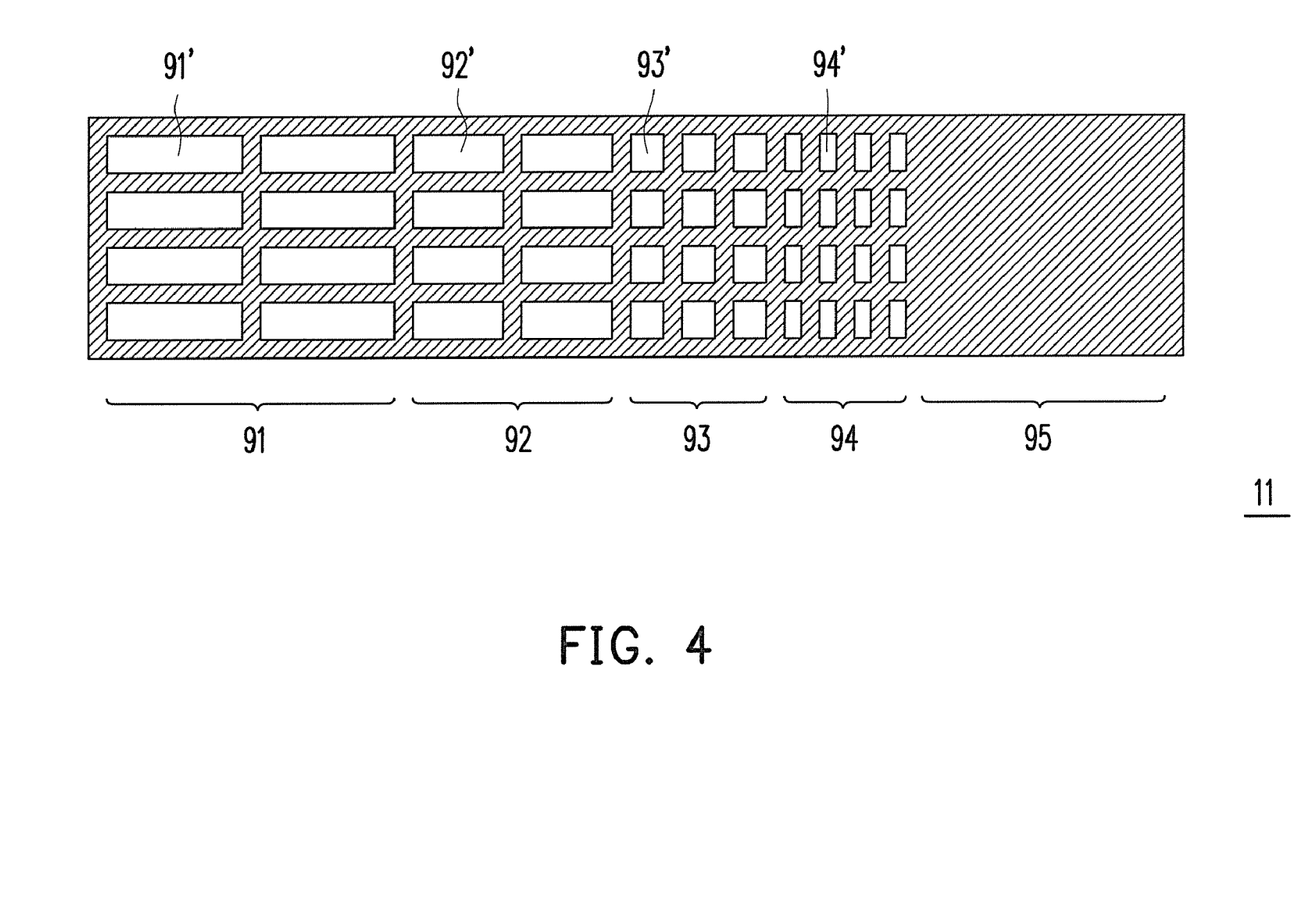
FIG. 4 illustrates an elastic wave transmission element according to another exemplary embodiment of the present disclosure.

The number of the structures and defects thereof in the elastic wave transmission element 10 of FIG. 1 is merely one possible option and should not be regarded as limiting. In other embodiments, the number of the structures and defects thereof in the elastic wave transmission element can be modified based on actual requirements. For example, FIG. 4 illustrates an elastic wave transmission element according to another embodiment of the present disclosure. The elastic wave transmission element 11 includes structures 91-95. The structure 91 has a plurality of defects 91'. Similarly, the structures 92-94 have a plurality of defects 92', a plurality of defects 93', and a plurality of defects 94', respectively. As such, the acoustic impedance of the structures 95-91 gradually decreases which thus providing acoustic impedance match function to the elastic wave transmission element 11.

Figure 5:
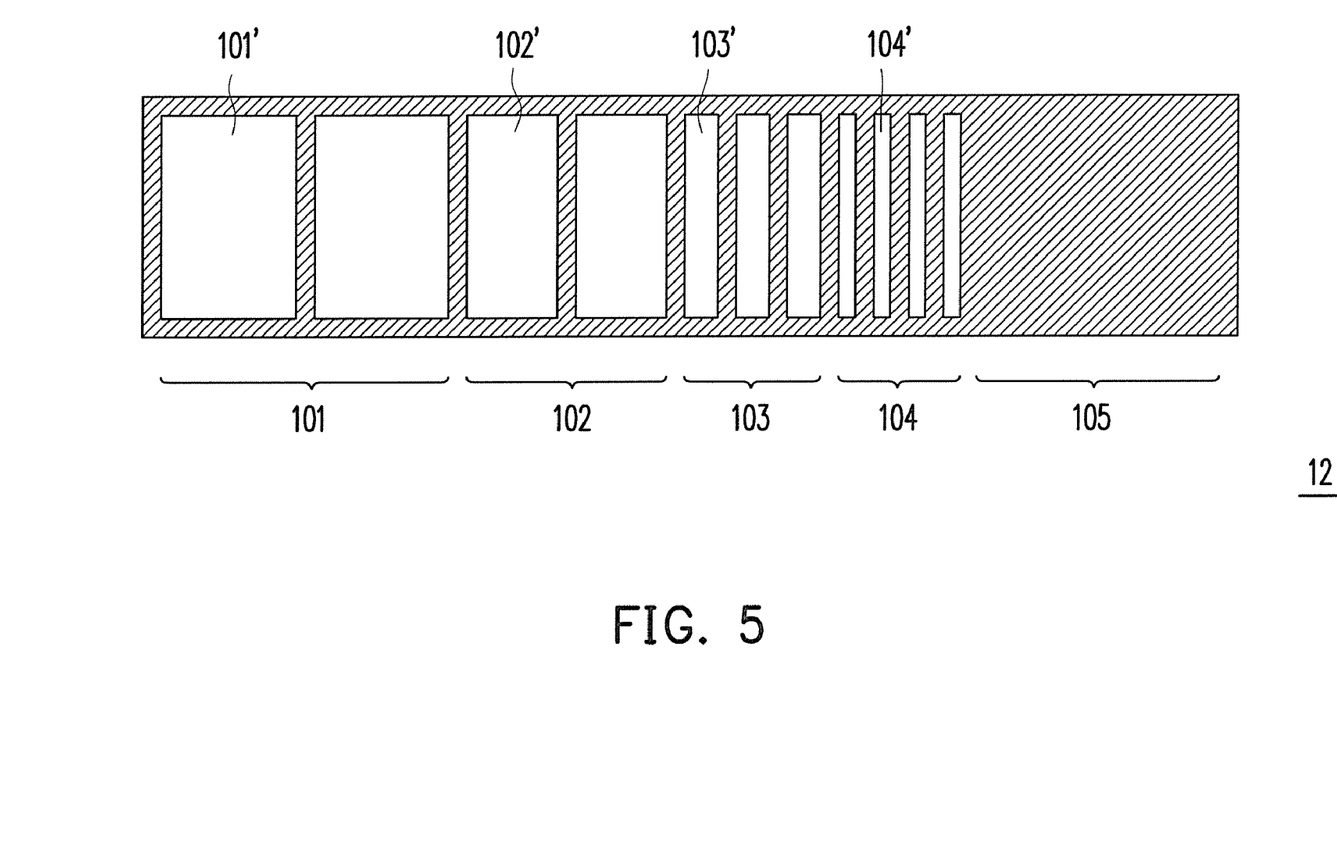
FIG. 5 illustrates an elastic wave transmission element according to another exemplary embodiment of the present disclosure.

As another example, FIG. 5 illustrates an elastic wave transmission element according to another embodiment of the present disclosure. The elastic wave transmission element 12 includes structures 101-102. The structure 101 has a plurality of defects 101'. Similarly, the structures 102-104 have a plurality of defects 102', a plurality of defects 103', and a plurality of defects 104', respectively. As such, the acoustic impedance of the structures 105-101 gradually decreases which thus providing an acoustic impedance match function to the elastic wave transmission element 12. Besides, the size, position and number of the defects can be modified to cause energy at particular frequency to be effectively transmitted, which is described in detail below.

Figure 6:
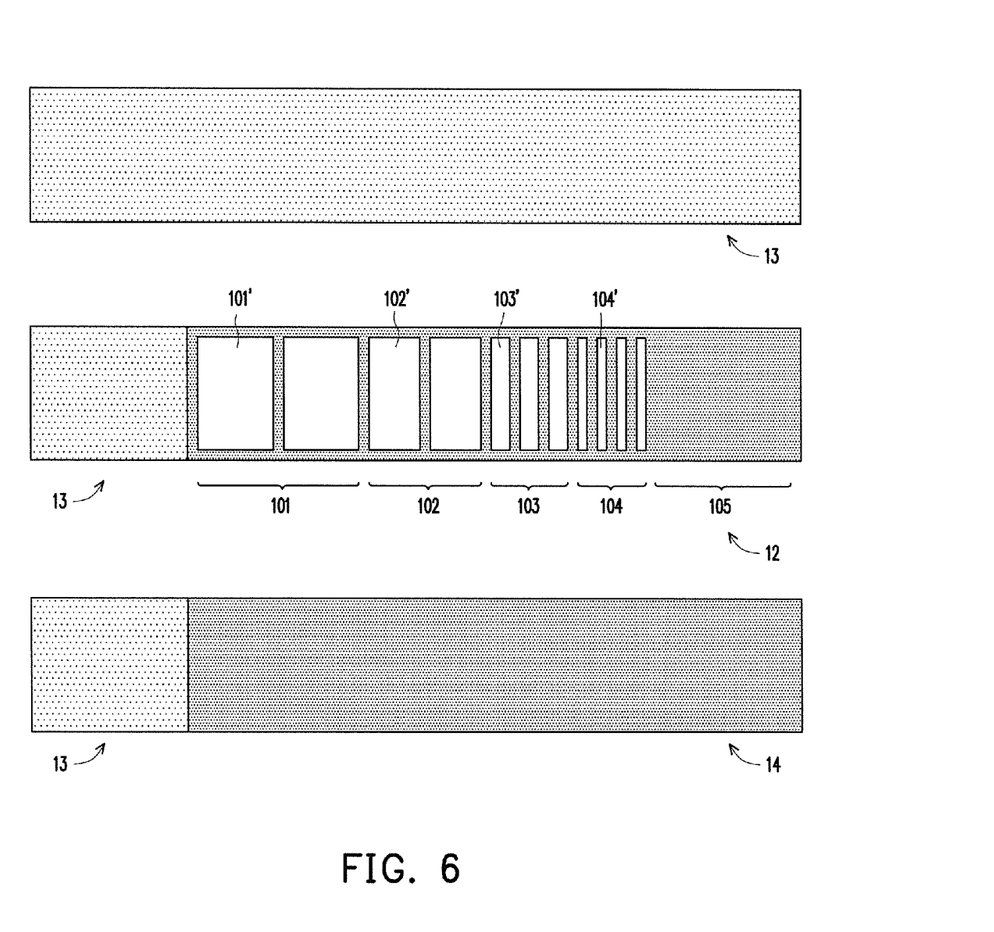
FIG. 6 illustrates several elastic wave transmission elements according to another exemplary embodiment of the present disclosure.
Figure 7:
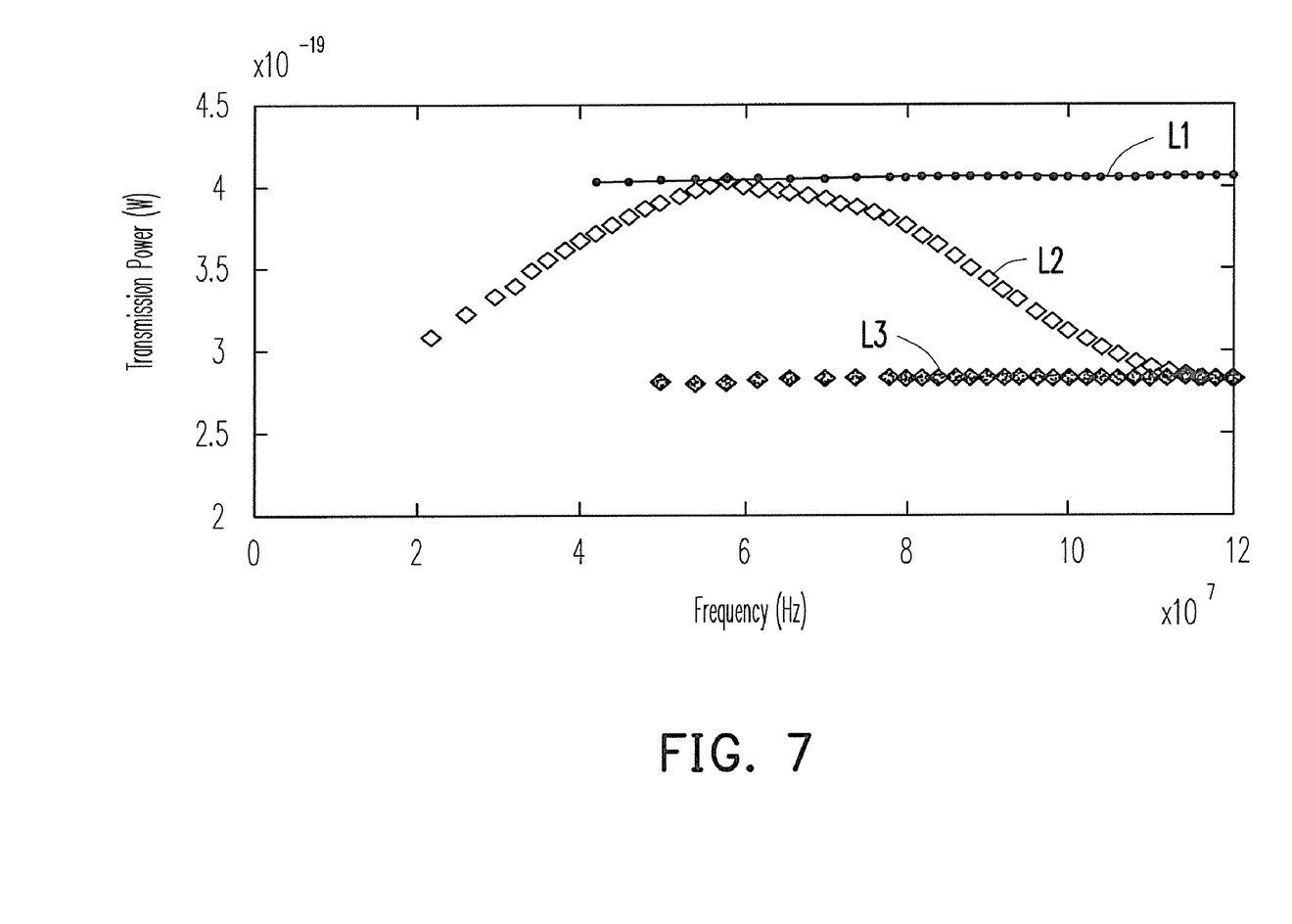
FIG. 7 is a diagram showing the relationship between the transmission power and frequency of several elastic wave transmission elements according to the exemplary embodiment of FIG. 6.

FIG. 6 illustrates a multiple elastic wave transmission element according to another embodiment of the present disclosure. FIG. 7 is a diagram showing the relationship between the transmission power and frequency for the different elastic wave transmission elements according to the embodiment of FIG. 6. Referring to FIG. 6 and FIG. 7, in this embodiment, the material of the element 14 and the material of the structure 105 have the same acoustic impedance, and the acoustic impedance of the material of the structure 13 is less than the acoustic impedance of the structure 101. When the elastic wave is transmitted through the element 13, the transmission power and frequency have a relationship as indicated by the dotted line L1 in FIG. 7. When the elastic wave is transmitted through the element 13 to element 105, the transmission power and frequency have a relationship as indicated by the dotted line L2 in FIG. 7. When the elastic wave is transmitted through the element 13 to the element 14, the transmission power and frequency have a relationship as indicated by the dotted line L3 in FIG. 7.

There is no acoustic impedance match issue when the elastic wave is transmitted through the element 13 (as indicated by the dotted line L1). However, the transmission power significantly decreases (as indicated by the dotted line L3) due to the acoustic impedance mismatch when the elastic wave is transmitted through the element 13 to the element 14. It is noted that the elastic wave transmission element 12 has gradually variant structure defects which provide impedance match function to the elastic wave transmission element 12. Therefore, when the elastic wave is transmitted between the element 13 and the elastic wave transmission element 12, energy reflection can be effectively suppressed. As can be seen from FIG. 7, the performance shown by the dotted line L2 at certain frequency band is superior to that shown by the dotted line L3.

In addition, in the present embodiment, the dotted line L2 has a rather high transmission power at the frequency of $6 \times 10^7$ which is approximately the same as the transmission power of the dotted line L1. However, it is not intended to limit the present disclosure to this particular embodiment. In alternative embodiments, the size, position and number of the defects can be adjusted to cause energy at particular frequency to be effectively transmitted.

Figure 8:
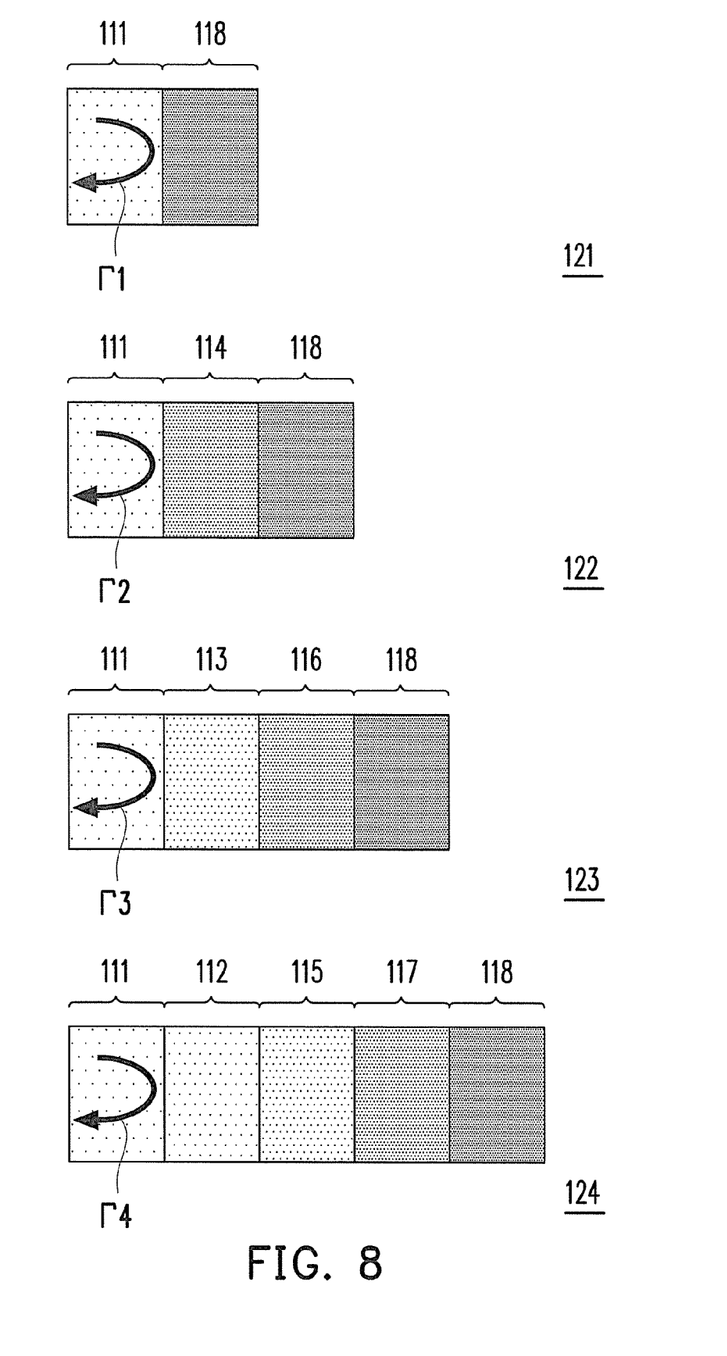
FIG. 8 illustrates several elastic wave transmission elements according to transmission line theory.
Figure 9:
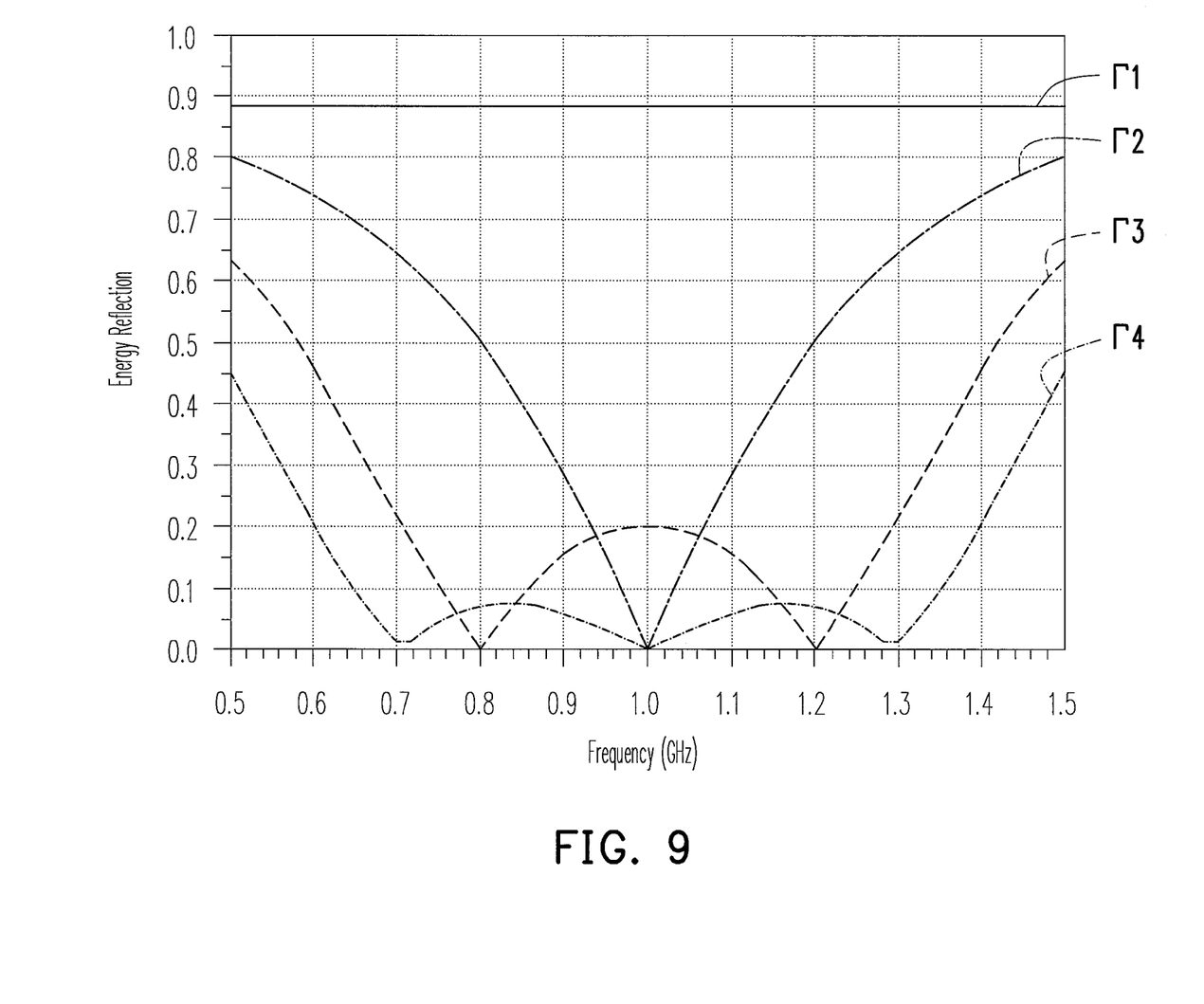
FIG. 9 is a diagram showing the relationship between the energy reflection and frequency of several elastic wave transmission elements illustrated in FIG. 8.
Figure 10:
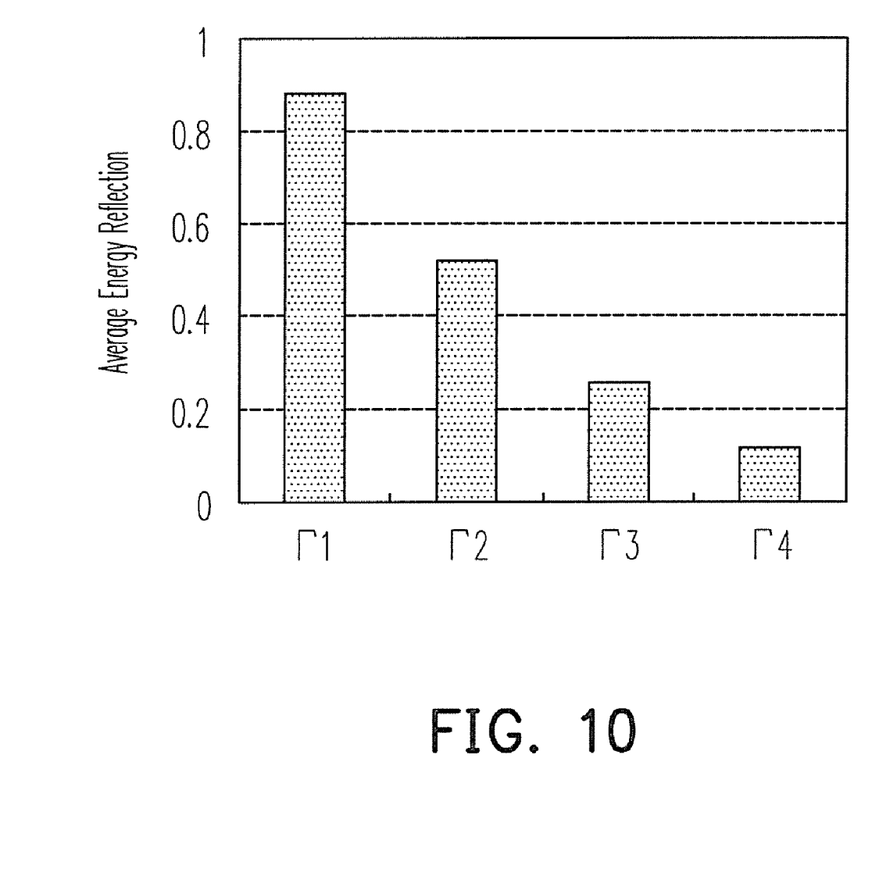
FIG. 10 is a diagram showing the relationship between the average energy reflection and the structures 121-124 of several elastic wave transmission elements illustrated in FIG. 8.

In addition, forming different number of the gradually variant structure defects in the element can also suppress the reflection energy of a particular frequency. For example, FIG. 8 illustrates several elastic wave transmission element according to transmission line theory. FIG. 9 is a diagram showing the relationship between the energy reflection and frequency of several elastic wave transmission elements illustrated in FIG. 8. FIG. 10 is a diagram showing the relationship between the average energy reflection and the structures 121-124 of several multiple elastic wave transmission elements illustrated in FIG. 8. Referring to FIGS. 8-10, the element 121 has structures 111 and 118. The element 122 has structures 111, 114, and 118. The element 123 has structure 111, 113, 114, and 118. The element 124 has structures 111, 112, 115, 117, and 118.

In the present embodiment, the average acoustic impedance of the structures 111-118 is described as 50, 80, 110, 200, 205, 360, 515, and 800, which are representative numbers in proportion to their actual acoustic impedance. In addition, in the present embodiment, transmission of the elastic wave through the elements 121-124 causes the energy reflection $\Gamma 1$-$\Gamma 4$, respectively. As can be seen from FIG. 9, the energy reflection $\Gamma 2$ is rather low only at 1 GHz. Similarly, the energy reflection $\Gamma 3$ is rather low at 0.8 GHz and 1.2 GHz, and the energy reflection $\Gamma 4$ is rather low at 0.71 GHz, 1 GHz, and 1.29 GHz. Upon reading the foregoing disclosure, persons skilled in the art would appreciate that different number of the gradually variant structure defects can be used to reduce the energy reflection at a particular frequency in other embodiments.

On the other hand, from FIG. 10, it is apparent that the average energy reflection decreases with the increasing of the number of the gradually variant structure defects. As such, in other embodiments of the present disclosure, the number of the gradually variant structure defects can be increased to reduce the average energy reflection.

In summary, in embodiments of the present disclosure, the elastic wave transmission elements are formed with gradually variant structure defects to result in gradually varying of acoustic impedance along the transmission direction of the elastic wave. Therefore, the elements can have impedance match function. Other advantages of the embodiments of the present disclosure include that:

1. Energy at particular frequency can be effectively transmitted by modifying the size, position and number of the structure defects.

2. The energy reflection at particular frequency can be reduced by using different number of the gradually variant structure defects.

3. The average energy reflection can be reduced by increasing the number of the gradually variant structure defects.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. An elastic wave transmission element having a first side and a second side, comprising:
   at least three structures successively arranged in a direction from the first side toward the second side, each of the structures having a defect, wherein the defect is an absence of the structure with a closed area and the shape of the defect is gradually changed along a wave transmission direction, the acoustic impedance of the plurality of structures gradually decreasing along said wave transmission direction.

2. The elastic wave transmission element according to claim 1, wherein the first side of the elastic wave transmission element is adapted to be connected with a first element, the second side of the elastic wave transmission element is adapted to be connected with a second element, the acoustic impedance of the first element is greater than the impedance of each of the structures, and the acoustic impedance of the second element is less than the impedance of each of the structures.

3. The elastic wave transmission element according to claim 1, wherein the said defect has one or more slots or holes.

4. A resonator comprising:
   a base body;
   a first structure having a first end connected with a first end of the base body and having a first defect; and
   a second structure connected to a second end of the first structure and having a second defect, wherein the acoustic impedance of the base body is greater than the acoustic impedance of the first structure, and the acoustic impedance of the first structure is greater than the acoustic impedance of the second structure.

5. The resonator according to claim 4, further comprising:
   a third structure having a first end connected to a second end of the base body and having a third defect; and
   a fourth structure connected to a second end of the third structure and having a fourth defect, wherein the acoustic impedance of the base body is greater than the acoustic impedance of the third structure, and the acoustic impedance of the third structure is greater than the acoustic impedance of the fourth structure.

* * * * *